United States Patent [19]
Dartnell et al.

[11] Patent Number: 6,002,269
[45] Date of Patent: Dec. 14, 1999

[54] TTL LOGIC DRIVER CIRCUIT

[75] Inventors: Peter Dartnell, Kent; Joseph Chan, Middlesex, both of United Kingdom

[73] Assignee: Northern Telecom Limited, Montreal, Canada

[21] Appl. No.: 08/996,866

[22] Filed: Dec. 23, 1997

[30] Foreign Application Priority Data

Dec. 23, 1996 [GB] United Kingdom .................. 9626773

[51] Int. Cl.[6] .................. H03K 19/0175; H03K 19/082
[52] U.S. Cl. .................. 326/92; 326/128; 326/80; 326/33; 327/589
[58] Field of Search .................. 326/89, 90, 92, 326/128, 126, 88, 84, 110, 76, 78, 33, 80; 327/390, 589, 108, 1 R

[56] References Cited

U.S. PATENT DOCUMENTS

| | | | |
|---|---|---|---|
| 4,002,931 | 1/1977 | Tsang | 307/264 |
| 4,476,403 | 10/1984 | Allen | 307/475 |
| 4,926,065 | 5/1990 | Coy et al. | 326/68 |
| 5,027,013 | 6/1991 | Coy et al. | 326/68 |
| 5,089,724 | 2/1992 | Chuang et al. | 326/124 |
| 5,216,296 | 6/1993 | Tsunoi et al. | 326/126 |
| 5,237,216 | 8/1993 | Hayano et al. | 326/126 |

*Primary Examiner*—Michael Tokar
*Assistant Examiner*—Richard Roseen
*Attorney, Agent, or Firm*—Lee, Mann, Smith, McWilliam, Sweeney & Ohslon

[57] ABSTRACT

A bootstrap logic driver circuit operable from a low voltage power supply includes first and second bipolar transistors coupled between positive and negative voltage supplies and having a collector load comprising a first diode structure. A further transistor coupled between the voltage supplies has a collector load comprising a second diode structure. A bootstrap capacitor coupled between the diode structures stores charge when the circuit is in a first condition and is discharged when the circuit is in a second condition to provide an enhanced drive voltage for an output transistor.

6 Claims, 3 Drawing Sheets

TTL LOGIC DRIVER CIRCUIT

This invention relates to integrated circuits and in particular to bipolar logic circuits for use in conjunction with CMOS devices.

BACKGROUND OF THE INVENTION

Although introduced over thirty years ago, the TTL (transistor-transistor logic) integrated logic standard fabricated in an npn bipolar process is still widely used as an interface in current CMOS digital systems. Bipolar circuits have the particular advantage of being able to operate at the high speeds that are required in current telecommunications transmission systems. These TTL circuits have a standard 'totem pole' output stage comprising a series connected pair of transistors providing a respective pull-up and pull-down stage. Although low voltage excursion is achievable from the pull-down stage, the high voltage excursion of the pull-up stage is limited by the supply voltage that is applied to the circuit. At best, the high voltage output is limited to a value equal to the positive supply voltage less the sum of the base-emitter voltages ($Vbe_{ON}$) of the two output transistors in their conductive state. The magnitude of the voltage $Vbe_{ON}$ is determined by current density and temperature, but is generally between 0–6 and 1.0 volts. In the past, the effect of the value of $Vbe_{ON}$ on the output voltage has not been a significant problem as it is relatively small in comparison with the standard circuit supply voltages of 12 volts and 5 volts. However newer CMOS designs having a supply voltage of only 3.3 volts are now being introduced. With such a low supply voltage, the output of a conventional TTL output stage falls below the 2–4 volts that is required for adequate circuit performance.

A possible solution to this problem is the provision of an additional power supply for the TTL circuitry. This however is generally inconvenient both in terms of added complexity and increased cost.

SUMMARY OF THE INVENTION

The object of the invention is to minimise or to overcome this disadvantage.

It is a further object of the invention to provide a bipolar logic driver circuit arrangement having an enhanced voltage output from a low voltage power supply.

According to the invention there is provided a bootstrap logic driver circuit having first and second output voltage conditions responsive to respective first and second input conditions and operable from a power supply having high (positive) and low (negative) voltage outputs, the circuit including a first bipolar transistor coupled between said high and low voltage supplies and having a collector load comprising a first diode structure, a second bipolar transistor coupled between the voltage supplies and having a collector load comprising a series connected second diode structure and a resistor, a bootstrap capacitor coupled between said first and second diode structures and being arranged to store charge during the first output condition of the circuit so as to provide during the second output condition of the circuit a voltage higher than said high voltage at its connection with the second diode structure, and output means driven from the bootstrap capacitor.

According to another aspect of the invention there is provided a bootstrap logic driver circuit having first and second output voltage conditions responsive to respective first and second input conditions and operable from a power supply having high (positive) and low (negative) voltage outputs, the circuit including a first bipolar transistor coupled between high and low voltage supplies and having a collector load comprising a first diode structure constituted by second and third bipolar transistors, a fourth bipolar transistor coupled between the voltage supplies and having a collector load comprising a second diode structure constituted by a fifth bipolar transistor and a resistor connected in series therewith, a sixth bipolar transistor comprising an emitter follower output stage coupled to the collector of the fourth transistor, and a bootstrap capacitor coupled between said first and second diode structures and being arranged to store charge during the first output condition of the circuit so as to provide during the second output condition a voltage higher than said high voltage at its connection with the second diode structure and at the collector of the fourth transistor so as to drive said emitter follower output transistor between first and second output conditions.

According to a further aspect of the invention, there is provided a method of generating a bootstrapped output in a logic driver circuit having first and second output voltage conditions responsive to respective first and second input conditions and operable from a power supply having high (positive) and low (negative) voltage outputs, said circuit including a first bipolar transistor coupled between high and low voltage supplies and having a collector load comprising a first diode structure, a second bipolar transistor coupled between the voltage supplies and having a collector load comprising a second diode structure, and a bootstrap capacitor coupled between said first and second diode structures, wherein the method comprises charging said bootstrap capacitor when the circuit is in its first condition, and discharging the bootstrap capacitor when the circuit is in its second condition so as to generate a voltage higher than said high voltage.

The circuit generates a controlled temporary, higher than supply voltage during the output high excursion by the use of a bootstrapped floating capacitor. Charge lost by this capacitor during the output high excursion as a result of pull-up base current demand is replenished during the following output low excursion.

Advantageously, the circuit structure is provided as part of an integrated circuit.

The circuit is of particular application in a telecommunications repeater where it may be used to drive CMOS circuitry at the high bit rates that are employed in current telecommunications transmission techniques. In such circumstances, the two circuit technologies may be mounted on a common circuit board or carrier and thus share a common power supply.

BRIEF DESCRIPTION OF THE DRAWINGS

An embodiment of the invention will now be described with reference to the accompanying drawings in which.

DESCRIPTION OF PREFERRED EMBODIMENT

Figure 1:
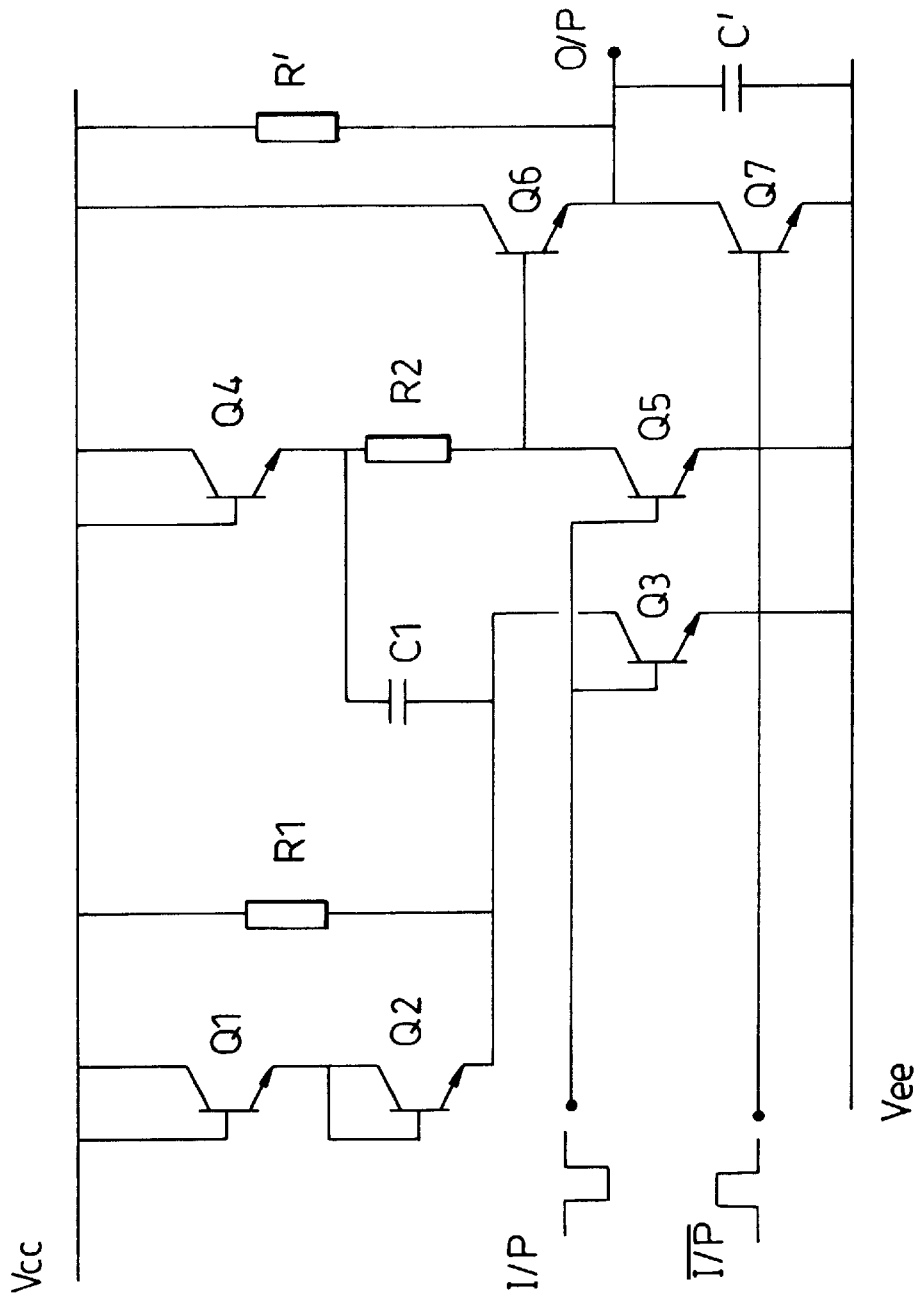
FIG. 1 is a schematic diagram of the logic driver circuit.

Referring to FIG. 1, the logic driver circuit, which will preferably be constructed in integrated form on a silicon substrate, comprises a diode connected transistor chain Q1, Q2 coupled between the circuit positive voltage and negative voltage supply rails $V_{CC}$, $V_{EE}$ via the collector-emitter path of transistor QS. The transistor chain Q1, Q2 is shunted by resistor R1. A further diode connected transistor Q4 is coupled between the positive voltage supply rail $V_{cc}$ and the collector emitter path of transistor Q5 via resistor R2. A bootstrap capacitor C1 is coupled between the emitter terminal of transistor Q4 and the emitter and collector terminal of transistors Q2 and Q3 respectively. Where the circuit arrangement of FIG. 1 is to be employed together with CMOS circuitry, the positive supply rail may constitute the local equipment ground potential.

The circuit of FIG. 1 has first (high) and second (low) output conditions respectively at the collector of transistor Q5 determined by corresponding low (logic ZERO) and high (logic ONE) current input signals (I/P) applied to the base terminals of transistors Q3 and Q5. The circuit output may be taken from an emitter follower stage comprising pull up or output transistor Q6 coupled to the collector of transistor Q5 and a pull down transistor Q7 arranged in series with the output transistor. The inverse (I/P*) of the input signal is coupled to the base of the pull down transistor Q7. The circuit output is shunted by a small capacitance C' which represents the input capacitance of a CMOS circuit (not shown) which, in use, will be driven by the logic driver circuit. Advantageously, the collector-emitter path of the output transistor Q6 is shunted by a high value resistor R'.

During an output low excursion corresponding to a high input signal I/P, current is supplied to the base terminals of transistors Q3 and Q5 which are thus both turned on so as to draw respective currents causing the voltage at the emitter terminal of transistor Q2 and the voltage at the collector terminal of transistor QS to fall. The pull down transistor Q7 is turned on as the corresponding inverse input signal I/P* applied to its base is in its high condition. The voltage at the emitter of transistor Q2 is clamped by the diode connected chain of transistors Q1 and Q2 to a value equal to $2V_{be}$ where $V_{be}$ is the base-emitter voltage drop of a bipolar transistor in its conductive state. The bootstrap capacitor C1 is charged via the diode comprised by transistor Q4 until the voltage at the emitter terminal of Q4 reaches a value equal to $V_{be}$, below the positive supply voltage. A voltage of $V_{be}$ is therefore developed across the capacitor C1 with its terminal connected to the emitter terminal of transistor Q4 being at the higher potential.

When transistors Q3 and Q5 are turned off by disabling their base current supply, i.e. when the Input I/P signal is low, so as to drive the circuit output to its high condition, the consequent lack of current flow through resistor R2 causes the collector voltage of transistor QS to rise to the supply voltage. The charge stored in the bootstrap capacitor C1 maintains a voltage of $V_{be}$ across the capacitor and, with the emitter terminal of transistor Q2 rising towards the positive supply voltage, provides bootstrapping of the emitter terminal voltage of transistor Q4 towards a value $V_{be}$ above the supply voltage. The diode constituted by transistor Q4 becomes reverse biased thus isolating the emitter terminal of Q4 from the positive supply rail. The charge stored on capacitor Cl is depleted only by the base current demand of the pull-up emitter follower transistor Q6 during the positive-going transient of the high output. In the high output condition of the circuit, resistors R1 and R2 form a potential divider which ameliorates the bootstrapping effect so as limit the maximum bootstrapped potential to one half of the capacitor potential difference, i.e. to one half of the voltage Vbe above the positive supply voltage.

Figure 2:
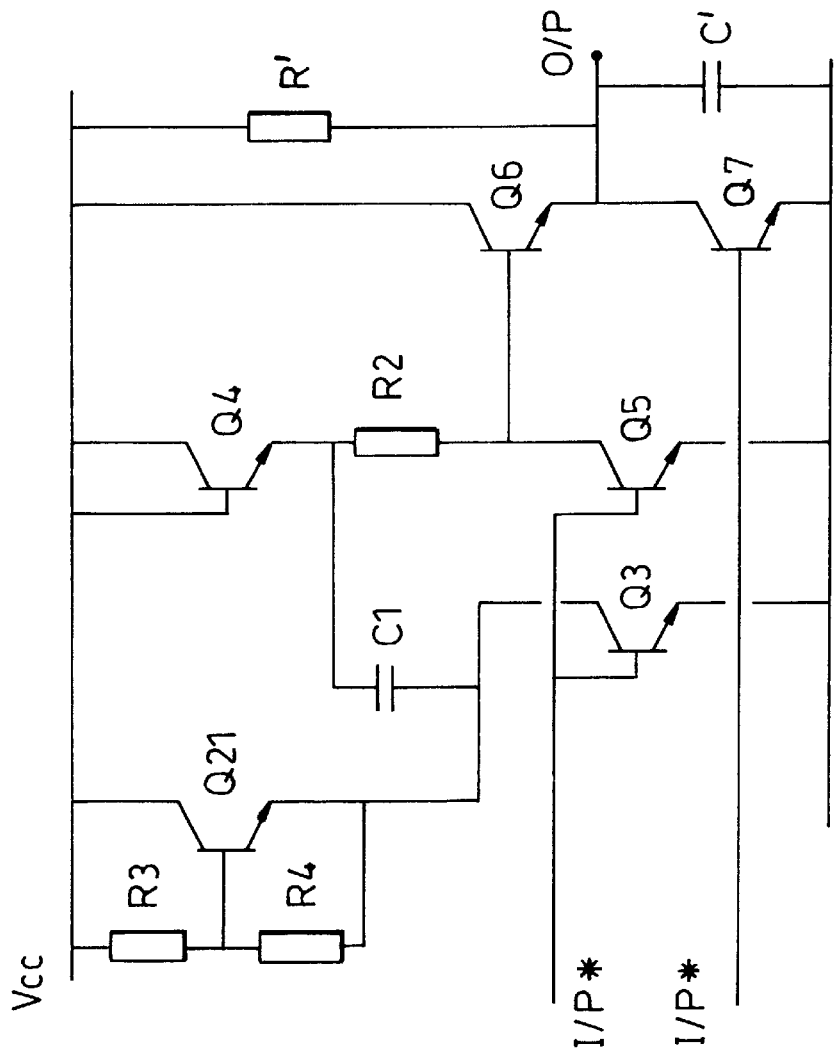
FIG. 2 shows a modification of the circuit of FIG. 1.

In the modified circuit is shown in FIG. 2, the transistors Q1, Q2, and the resistor R1 have been replaced with a $V_{BE}$ multiplier comprising transistor Q21 and resistors R3 and R4. Preferably, the resistors R3 and R4 are substantially equal in value. In this arrangement, the transistors Q3, Q5, and Q7 are all driven by the inverse input signal I/P*. When this signal is in its high condition, the circuit output O/P is low, and when the signal I/P* is in its low condition the output is high. The voltage at the emitter of transistor Q2 is clamped by the $V_{BE}$ multiplier to a value equal to $2V_{BE}$. A voltage of $$\left(\frac{R3}{R4}\right)V_{BE}$$

is developed across the bootstrap capacitor.

The final voltage $V_{OH}$ is dependent primarily on the value of the bootstrap capacitor C1, the shunt capacitance C' and the bootstrap voltage given by $(R3/R4)_{BE}$ such that $$V_{OH} = (V_{cc} - V_{ee}) - V_{BE} + (R3/R4)V_{BE}\left(\frac{1}{1+\frac{C'}{\beta C1}}\right)$$

Where $V_{OH}$ is the output high voltage and $\beta$ is the bipolar transistor current gain.

The potential divider formed by R3, R4 and Q21 allows the degree of bootstrapping of the $V_{OH}$ to be adjusted e.g. to compensate for a known load capacitance so that the $V_{OH}$ can be made as high as possible without saturating the pull up transistor Q6.

Figure 3:
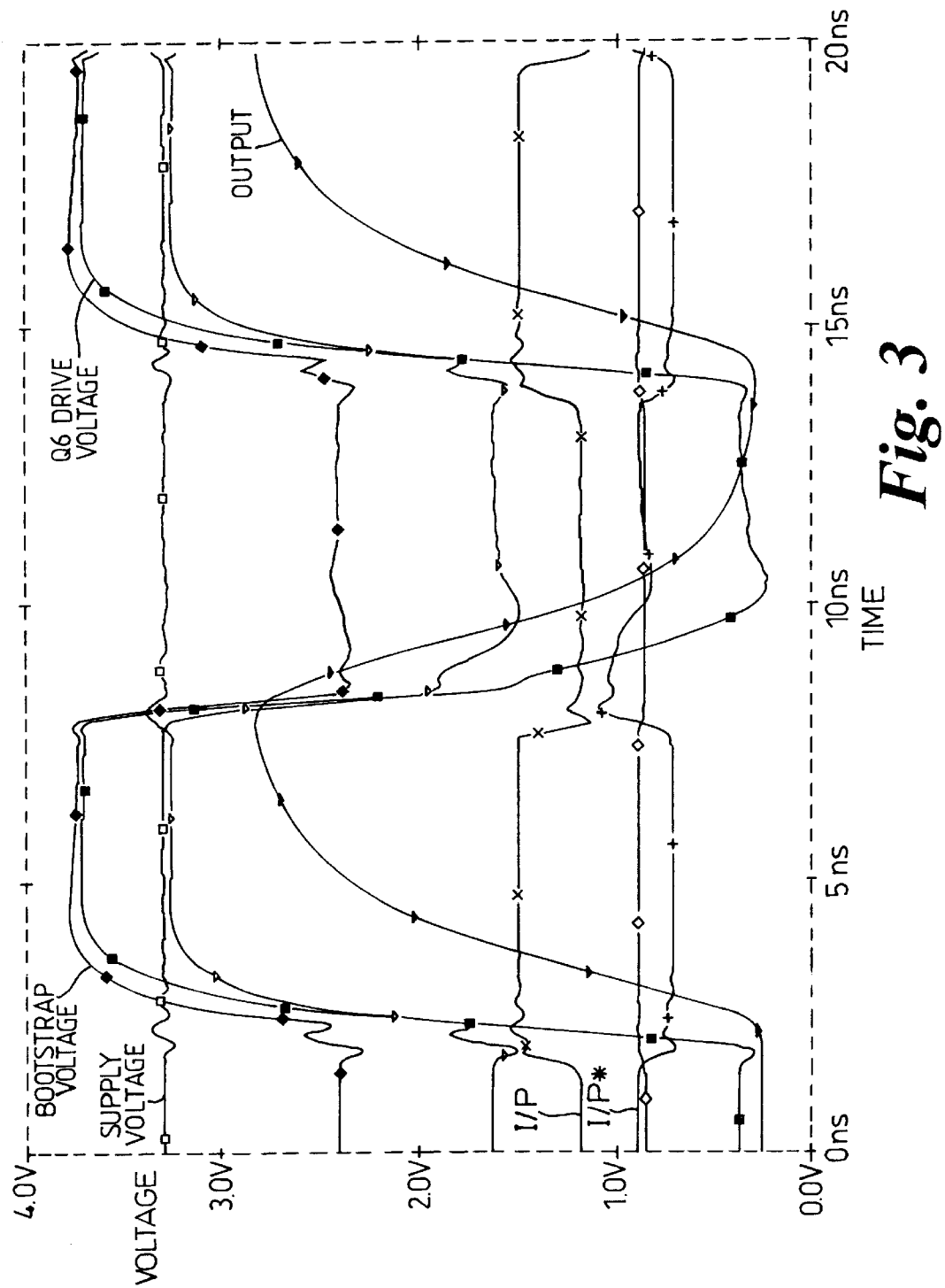
FIG. 3 illustrates the output characteristics of the driver circuit of FIG. 1.

The bootstrapping effect is illustrated in FIG. 3 which shows the voltages appearing at the emitter terminal of transistor Q4, at the emitter terminal of transistor Q2 and at the circuit output, in response to a logic input signal. As shown in FIG. 2, the voltage at the emitter of transistor Q4 reaches a sufficient value above the power supply positive voltage during the high voltage excursion to provide an effective drive to the output transistor Q6 even when the power supply voltage is as low as the present 3 volt standard for CMOS circuitry. This enables the circuit to share a 3 volt power supply with associated CMOS circuitry (not shown).

It will be understood that the above description of a preferred embodiment is given by way of example only and that various modifications may be made by those skilled in the art without departing from the spirit and scope of the invention.

We claim:

1. A bootstrap logic driver circuit having first and second output voltage conditions responsive to respective first and second input conditions and operable from a power supply having high (positive) and low (negative) voltage outputs, the circuit including a first bipolar transistor coupled between said high and low voltage supplies and having a collector load comprising a first diode structure, a second bipolar transistor coupled between the voltage supplies and having a collector load comprising a series connected second diode structure and a resistor, a bootstrap capacitor coupled between said first and second diode structures and being arranged to store charge during the first output condition of the circuit so as to provide during the second output condition of the circuit a voltage higher than said high voltage at its connection with the second diode structure, and output means driven from the bootstrap capacitor.

2. A bootstrap logic driver circuit as claimed in claim 1, wherein said first diode structure comprises a series connected pair of bipolar transistors, each transistor of the pair having its base terminal connected to its collector terminal.

3. A bootstrap logic driver circuit as claimed in claim 2, wherein said second diode structure comprises a further bipolar transistor having its base terminal connected to its collector terminal.

4. A bootstrap logic driver circuit as claimed in claim 3, wherein said output means comprises an emitter follower transistor.

5. A bootstrap logic driver circuit having first and second output voltage conditions responsive to respective first and second input conditions and operable from a power supply having high (positive) and low (negative) voltage outputs, the circuit including a first bipolar transistor coupled between high and low voltage supplies and having a collector load comprising a first diode structure constituted by second and third bipolar transistors, a fourth bipolar transistor coupled between the voltage supplies and having a collector load comprising a second diode structure constituted by a fifth bipolar transistor and a resistor connected in series therewith, a sixth bipolar transistor comprising an emitter follower output stage coupled to the collector of the fourth transistor, and a bootstrap capacitor coupled between said first and second diode structures and being arranged to store charge during the first output condition of the circuit so as to provide during the second output condition a voltage higher than said high voltage at its connection with the second diode structure and at the collector of the fourth transistor so as to drive said emitter follower output transistor between first and second output conditions.

6. A method of generating a bootstrapped output in a logic driver circuit having first and second output voltage conditions responsive to respective first and second input conditions and operable from a power supply having high (positive) and low (negative) voltage outputs, said circuit including a first bipolar transistor coupled between high and low voltage supplies and having a collector load comprising a first diode structure, a second bipolar transistor coupled between the voltage supplies and having a collector load comprising a second diode structure, and a bootstrap capacitor coupled between said first and second diode structures, wherein the method comprises charging said bootstrap capacitor when the circuit is in its first condition, and discharging the bootstrap capacitor when the circuit is in its second condition so as to generate a voltage higher than said high voltage.

* * * * *